US010215831B2

(12) United States Patent
Bachschmidt et al.

(10) Patent No.: US 10,215,831 B2
(45) Date of Patent: Feb. 26, 2019

(54) METHOD AND MAGNETIC RESONANCE SYSTEM TO DETERMINE A RESONANCE FREQUENCY DEVIATION

(71) Applicant: Siemens Aktiengesellschaft, Munich (DE)

(72) Inventors: Theresa Bachschmidt, Nuremberg (DE); Mathias Nittka, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 1351 days.

(21) Appl. No.: 14/245,331

(22) Filed: Apr. 4, 2014

(65) Prior Publication Data
US 2014/0300357 A1    Oct. 9, 2014

(30) Foreign Application Priority Data

Apr. 4, 2013   (DE) ........................ 10 2013 205 930

(51) Int. Cl.
*G01R 33/565* (2006.01)
(52) U.S. Cl.
CPC ... G01R 33/5659 (2013.01); G01R 33/56536 (2013.01)
(58) Field of Classification Search
USPC .......................... 324/300–322; 600/407–435; 382/128–131
See application file for complete search history.

(56) References Cited

U.S. PATENT DOCUMENTS

| 6,150,815 A * | 11/2000 | Janzen ................... B82Y 25/00 324/307 |
| 7,359,745 B2 | 4/2008 | Lewin et al. |
| 9,041,394 B2 * | 5/2015 | Umeda ............ G01R 33/56554 324/307 |

(Continued)

OTHER PUBLICATIONS

Lu et al: "SEMAC: Slice Encoding for Metal Artifact correction in MRI"; Magnetic Resonance in Medicine vol. 62: pp. 66-76, (2009).

(Continued)

*Primary Examiner* — Melissa Koval
*Assistant Examiner* — Tiffany Fetzner
(74) *Attorney, Agent, or Firm* — Schiff Hardin LLP

(57) ABSTRACT

In a first method and magnetic resonance apparatus to determine a resonance frequency deviation given an excitation of a slice of a volume segment within an examination subject, by a slice selection gradient is activated along one direction, an RF excitation pulse is irradiated in order to excite nuclear spins in the slice, a readout gradient is activated along the direction of the slice selection gradient, and MR data are read out while the readout gradient is activated. Image points within an MR image reconstructed using the MR data are identified, that exhibit a signal intensity that is greater than a predetermined threshold, in order to determine one of the image points that has a maximum separation in the direction between this image point and the slice. The resonance frequency deviation is determined depending on the amplitude of the slice selection gradient, the amplitude of the readout gradient and the maximum separation. The slice selection gradient and the readout gradient have opposite polarity.

20 Claims, 7 Drawing Sheets

(56) References Cited

U.S. PATENT DOCUMENTS

| | | | |
|---|---|---|---|
| 9,989,614 B2* | 6/2018 | Bachschmidt | G01R 33/34 |
| 2002/0145424 A1* | 10/2002 | Uetake | G01R 33/56563 |
| | | | 324/307 |
| 2010/0033179 A1 | 2/2010 | Hargreaves et al. | |
| 2011/0291653 A1* | 12/2011 | Umeda | G01R 33/5617 |
| | | | 324/309 |
| 2012/0119740 A1* | 5/2012 | Takahashi | A61B 5/055 |
| | | | 324/309 |
| 2013/0076356 A1 | 3/2013 | Jellus et al. | |
| 2014/0300357 A1* | 10/2014 | Bachschmidt | G01R 33/5659 |
| | | | 324/309 |
| 2015/0285890 A1* | 10/2015 | Bachschmidt | G01R 33/34 |
| | | | 324/309 |

OTHER PUBLICATIONS

Hargreaves et al: "Adaptive Slice Encoding for Metal Artifact Correction"; Proc. Intl. Soc. Mag. Reson. Med. vol. 18 p. 3083; (2010).

Li et al: "Distortion Scout in Metal Implants Imaging"; Proc. Intl. Soc. Mag. Reson. Med. vol. 19 p. 3169. ( 2011).

Lu et al:; ""POCS-Based Compressive Slice Encoding for Metal Artifact Correction""; Proc. Intl. Soc. Mag. Reson. Med., 19; p. 3174; (2011).

Lu et al..; "Compressive Slice Encoding for Metal Artifact Correction"; Proc. Intl. Soc. Mag. Reson. Med., vol. 18; p. 3079; (2010).

Worters et al..; "Metal Artifact Reduction Using Slice Encoding With Shear Correction"; Proc. Intl. Soc. Mag. Reson. Med. vol. 19; p. 292; (2011).

* cited by examiner

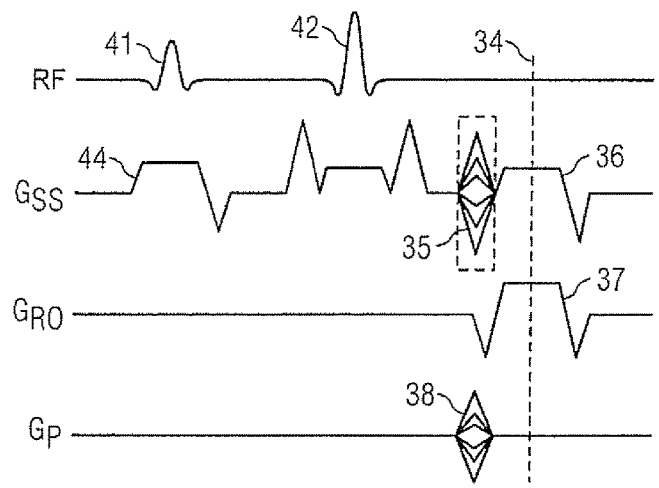
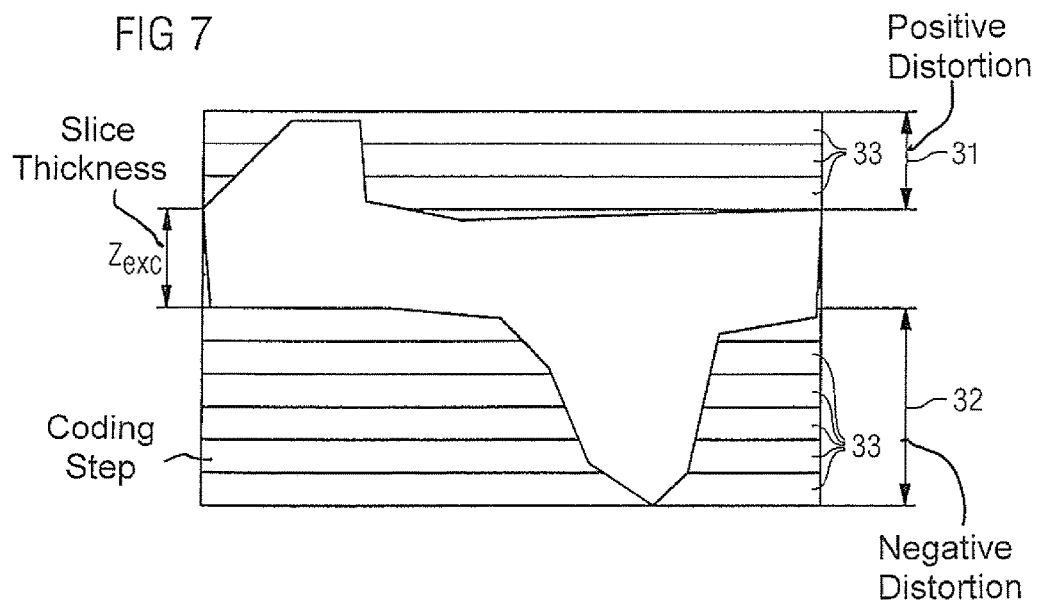

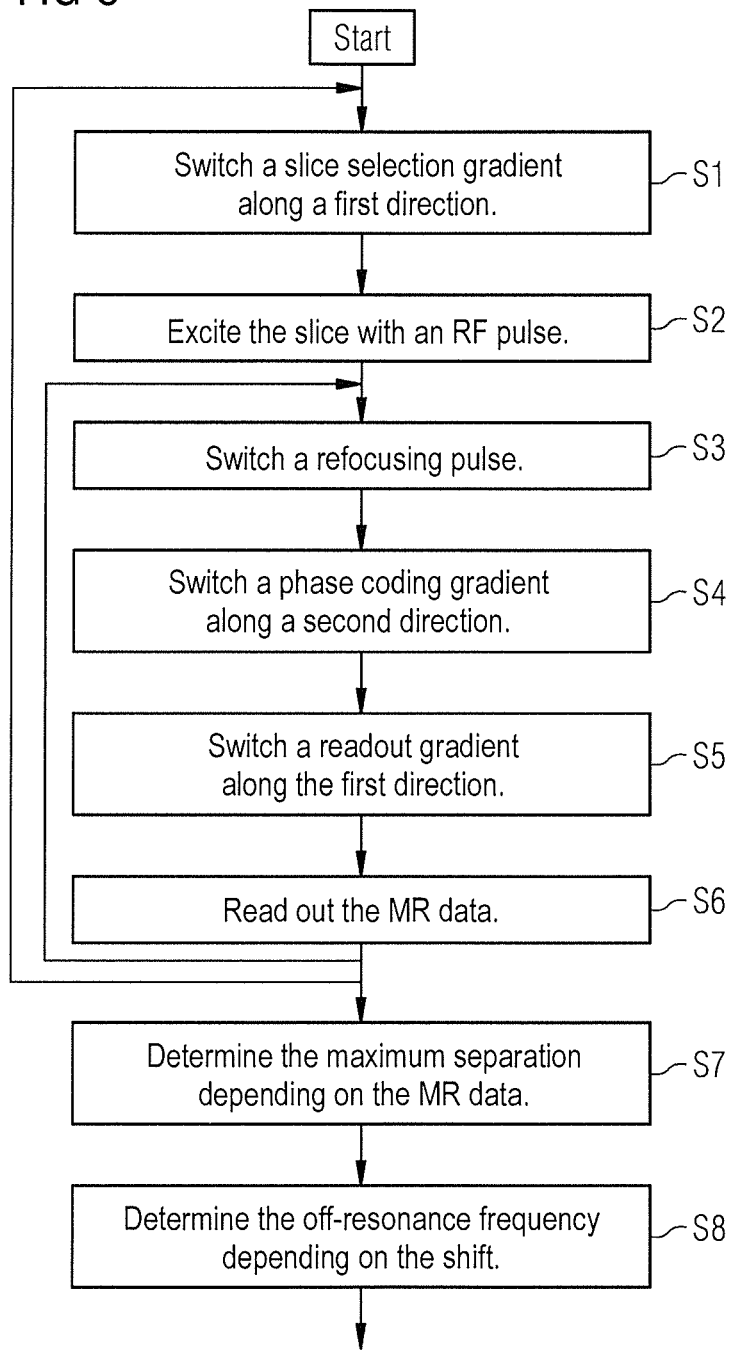

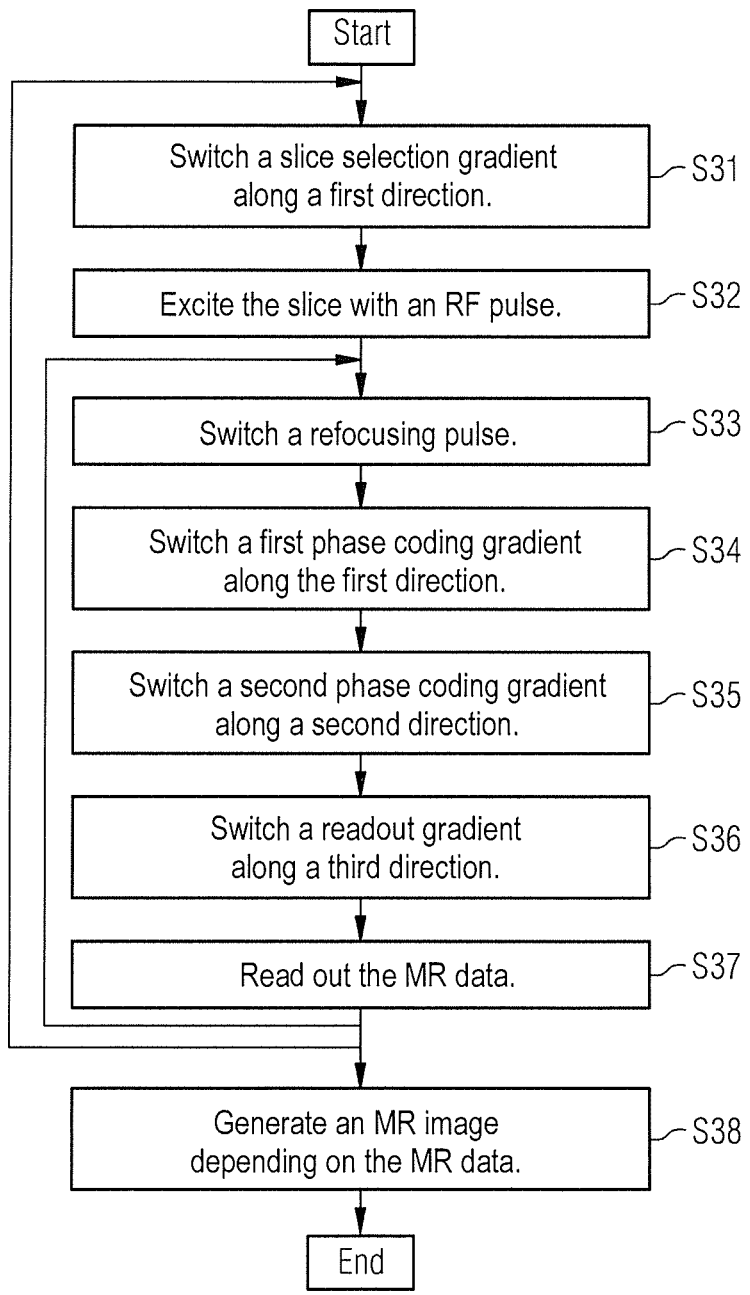

METHOD AND MAGNETIC RESONANCE SYSTEM TO DETERMINE A RESONANCE FREQUENCY DEVIATION

BACKGROUND OF THE INVENTION

Field of the Invention

The present invention concerns a method and a magnetic resonance system in order to determine a resonance frequency deviation namely an off-resonance (frequency), which occurs in the event of magnetic field inhomogeneities.

Description of the Prior Art

If a patient has a metallic implant and MR images of a volume segment in proximity to this implant are created, severe artifacts occur within these MR images. These artifacts are based for the most part on inhomogeneities of the basic magnetic field which in turn arise due to strong susceptibility differences between the metal of the implant and the surrounding tissue. A reliable diagnosis by a physician is in most cases is impossible based on MR images that exhibit these artifacts.

Among other things, inhomogeneities of the basic magnetic field have the effect that an excited slice in the slice selection direction is spatially distorted. The distortion or geometric shift of the slice that occurs due to the inhomogeneities is thereby proportional to the resonance frequency deviation. The resonance frequency deviation, or off-resonance frequency is the frequency difference between the ejected or theoretical resonance frequency of the nuclear spins at a defined location, and the actual resonance frequency of these spins that is detected. Expressed differently, the resonance frequency deviation is the frequency difference between the resonance frequency of the spins at a defined location given an optimally homogeneous basic magnetic field, and the actual resonance frequency of these spins that result due to inhomogeneities of the basic magnetic field.

In order to acquire all information belonging to the slice in spite of the distortions of that excited slice, according to the prior art it is known to additionally implement a phase coding in the slice selection direction, for example as is described in US 2010/0033179 A1 and in "SEMAC: Slice Encoding for Metal Artifact Correction in MRI", W. Lu et al., Magn. Res. in Med. 62: (2009), Pages 66-76.

The primary disadvantage of these known methods is in that the measurement time is multiple times longer since every slice is essentially scanned multiple times in comparison to a method without phase coding in the slice selection direction. The factor by which the measurement time increases corresponds to the number of phase coding steps in the slice selection direction.

Having knowledge of the resonance frequency deviation for each slice would enable the phase coding steps to be individually adapted for each slice in the slice selection direction, such that only exactly as many phase coding steps are implemented as are necessary to completely correct the distortions due to the inhomogeneities of the basic magnetic field.

For individual adaptation of the phase coding steps for each slice, for example, there exists a method as is described on Page 3083 in "Adaptive Slice Encoding for Metal Artifact Correction", B. A. Hargreaves et al., Proc. Intl. Soc. Mag. Reson. Med. 18 (2010). In this known method, however, information about high off-resonances is lost due to technical limitations since the signal is completely dephased before the beginning of the readout.

Another approach is described on Page 3169 in "Distortion Scout in Metal Implants Imaging", G. Li et al., Proc. Intl. Soc. Mag. Reson. Med. 19 (2011). In a turbo spin echo sequence, the readout gradient is thereby executed on the same spatial axis as the slice selection gradient. The total distortion or total shift of the slice which results due to the slice selection gradient and the readout gradient can be detected, and from this the resonance frequency deviation can be calculated, and the number of phase coding steps for each slice can be adapted individually.

However, in specific cases this known method detects no distortion of the slice in spite of strong off-resonances, and therefore determines a false resonance frequency deviation. Moreover, in this method the resonance frequency deviation in a single measurement can be determined only in the precision of the excitation bandwidth.

SUMMARY OF THE INVENTION

An object of the present invention is to determine the resonance frequency deviation more precisely than is possible according to the prior art, in particular in order to optimally determine the number of the phase coding steps in the slice selection direction in an MR imaging using this exactly determined resonance frequency deviation.

Within the scope of the present invention, a method determines a resonance frequency deviation, or off-resonance (frequency) given excitation of a slice of a volume segment within an examination subject situated in a magnetic resonance system, includes the following steps:

A slice selection gradient is activated along one direction. An RF excitation pulse is radiated in order to excite nuclear spins in the slice during the activated slice selection gradient. An RF refocusing pulse is radiated in order to refocus dephased spins or to generate an echo during activation of the slice selection gradient. A readout gradient is activated along the aforementioned direction. Read out MR data while the readout gradient is switched. Image points within an MR image reconstructed using the MR data. These image points have a signal intensity (brightness) that is greater than a predetermined threshold, and lie outside of the slice that corresponds to the plane which would be excited without the occurrence of off-resonances. The image point is determined that is farthest distant from this slice, in the direction of the slice selection gradient. The separation between this image point determined in such a manner and the slice (wherein the distance is measured in the form of a path orthogonal to the slice) is considered to be the maximum separation used in the following. This maximum separation can be a (positive) maximum separation in the direction of the slice selection gradient (meaning that the image point is spaced apart from the slice in the direction of the slice selection gradient) or a (negative) maximum separation in the direction opposite the direction of the slice selection gradient (meaning that the image point is spaced apart from the slice in the direction opposite the direction of the slice selection gradient).

The resonance frequency deviation is determined depending on the amplitude of the slice selection gradient, the amplitude of the readout gradient and the maximum separation. The resonance frequency deviation is greater (in terms of absolute magnitude) the larger the maximum separation (in terms of absolute magnitude). The absolute magnitude of the resonance frequency deviation can be determined as a product of a factor and the maximum separation, and the factor is determined depending on the amplitudes of the slice selection gradient and the readout gradient.

The slice selection gradient has a polarity opposite that of the readout gradient.

Because the slice-selection gradient and the readout gradient have different polarity, both the slice selection gradient and the readout gradient effectively produce a spatial shift of the slice in the same spatial direction, such that the maximum separation is greater according to the invention than if the slice selection gradient and the readout gradient were to have the same polarity. In other words: the shift of the slice due to the different polarity is more pronounced than it would be in the case of an identical polarity. This more pronounced shift and the correspondingly greater (in terms of absolute magnitude) maximum separation, are advantageous given the use of readout gradients with a high amplitude with which a larger frequency range is scanned, such that larger (in terms of absolute magnitude) resonance frequency deviations can advantageously be detected. This advantage is independent of whether the maximum separation is defined in the direction or opposite the direction.

Moreover, in the case of different polarities of slice selection gradients and readout gradients it is not possible for the shift generated due to the readout gradient essentially to cancel the shift generated by the slice selection gradient, which would lead to the situation of a resonance frequency deviation of 0 (i.e. no resonance frequency deviation) being incorrectly determined.

In the present invention, the term "image point" is frequently used. This normally (unless a different type of image point is explicitly described) means an image point that has a signal intensity that is greater (higher) than the predetermined threshold. This threshold is selected such that only image points that markedly differ from the noise of the MR image have a signal intensity above the threshold.

According to a preferred embodiment of the invention, for spatial coding at least one phase coding gradient is activated in at least one additional direction orthogonal to the direction in which the slice selection gradient is activated, before the MR data are read out. The step of reading out the MR data is repeated multiple times for different values of the at least one phase coding gradient.

In other words, the method according to the invention includes the following variants.

No phase coding gradient is switched. In this variant, the maximum separation is determined corresponding to the direction at a defined point (in particular in the middle of the slice). For the case that both the positive and the negative maximum separation are to be determined, these two maximum separations are determined at the defined point. The positive maximum separation defines the separation from the slice of that image point which is located as far as possible from the slice in the direction. The negative maximum separation defines the separation from the slice of that image point that is located as far as possible from the slice in the direction opposite the activation direction.

A phase coding gradient is switched in exactly one direction orthogonal to the slice selection direction. In this variant, the MR data are essentially acquired within an additional slice which is orthogonal to the slice and is defined by the slice selection direction and the direction of the phase coding gradient. Within an MR image that represents this additional slice that image point is determined which—corresponding to the direction—is farthest removed from the center line of the MR image (the position of the center line corresponds to the attitude of the slice). In this variant, the positive maximum separation is determined by the image point in this MR image that is removed as far as possible from the center line in the direction. The negative maximum separation in this variant is accordingly determined by the image point that is removed as far as possible from the center line in the direction opposite the activation direction.

For spatial coding, a first phase coding gradient is activated along a first additional direction and a second phase coding gradient is activated along a second additional direction. The first additional direction is situated orthogonally to the direction of the slice selection gradient and to the second additional direction, which means that the second additional direction is also situated orthogonally to the direction of the slice selection gradient and to the first additional direction. In this variant, the MR data are acquired within a three-dimensional volume segment in which the slice is arranged. The sought maximum separation is defined by that image point within this volume segment which has the greatest separation from the slice, corresponding to the direction. In this variant, the positive maximum separation is determined by that image point which has the greatest separation from the slice in the direction of the slice selection gradient. In this variant, the negative maximum separation is accordingly determined by that image point which has the greatest separation from the slice in the direction opposite the direction of the slice selection gradient.

The variants described in the preceding differ in the precision with which the resonance frequency deviation is determined, as well as in the duration that is required to acquire the MR data. While the first described variant is fastest but delivers only a rough indicative value for the resonance frequency deviation, the last described variant is slowest, the resonance frequency deviation to be precisely determined. The second described variant is a good compromise between duration and precision, such that this second variant should be used in practice.

The resonance frequency deviation $\Delta f$ can be determined by the following Equation (1):

$$\Delta f = \frac{\gamma}{2\pi} \times dz \times (G_R^{-1} - G_S^{-1})^{-1} \quad (1)$$

wherein $\gamma$ is the gyromagnetic ratio, dz is the maximum separation, $G_R$ is the amplitude of the readout gradient (46), and $G_S$ is the amplitude of the slice selection gradient. If dz is positive there is a positive maximum separation, and otherwise there is a negative maximum separation. It is apparent that the resonance frequency deviation $\Delta f$ can also be negative (positive) if dz is positive (negative), depending on $G_R$ and $G_S$.

The present invention also encompasses an additional method to determine a resonance frequency deviation given an excitation of a slice of a volume segment within an examination subject situated in a magnetic resonance system. The additional method includes the following steps.

A slice selection gradient is activated along one direction.

An RF excitation pulse is radiated in order to excite nuclear spins in the slice during the activated slice selection gradient.

An RF refocusing pulse is radiated in order to refocus dephased spins during activation of the slice selection gradient.

A first readout gradient is radiated along the direction of the slice selection gradient.

First MR data are read out while the first readout gradient is activated.

Image points within an MR image reconstructed are located (identified) using the MR data in order to determine the image point that is located a farthest distance from the slice, in the direction of the slice selection gradient. The separation between this image point and the slice, which separation is measured in the form of a path situated orthogonal to the slice, is thereby considered to be the first maximum separation as used in the following. A differentiation is thereby made between a positive first maximum separation (which exists when the corresponding image point is as distant as possible from the slice in the direction of the slice selection gradient) and a negative first maximum separation (which exists when the corresponding image point is as distant as possible from the slice in a direction opposite the direction of the slice selection gradient).

A second readout gradient along the direction of the slice selection gradient.

Second MR data are read out while the second readout gradient is activated

Image points within an MR image reconstructed are located (identified) using the MR data in order to thereby determine that image point that is located a farthest distance from the slice. The separation between this image point and the slice, which separation is measured in the form of a path situated orthogonal to the slice, is thereby considered to be the second maximum separation as used in the following. A differentiation is thereby made between a positive second maximum separation (which exists when the corresponding image point is as distant as possible from the slice in the direction of the slice selection gradient) and a negative second maximum separation (which exists when the corresponding image point is as distant as possible from the slice in a direction opposite the direction of the slice selection gradient).

The resonance frequency deviation is determined depending on the amplitude of the slice selection gradient, the amplitude of the readout gradient, the first maximum separation and the second maximum separation. The resonance frequency deviation has a (normally positive) polarity if it is determined depending on the positive first maximum separation and the positive second maximum separation, while resonance frequency deviation has a (normally negative) polarity opposite the aforementioned polarity if it is determined depending on the negative first maximum separation and the negative second maximum separation.

For example, when the resonance frequency deviation is determined using two readout gradients (in comparison to the method according to the invention as described initially), the precision of the resonance frequency deviation that is thereby determined can be increased beyond the order of magnitude of the excitation bandwidth.

According to the invention, "corresponding to the direction" can mean either "in the direction of the slice selection gradient" or "in the direction opposite the direction of the slice selection gradient". In the case of "in the direction", the (positive) maximum separation is determined only using the image points that are situated at a separation from the slice in the direction of the slice selection gradient, while in the other case the (negative) maximum separation is determined only using image points that are situated at a separation from the slice in the direction opposite the direction of the slice selection gradient.

Similar to the first described method according to the invention, in the further method at least one phase coding gradient can be activated in at least one additional direction orthogonal to the direction for the purpose of spatial coding, before the first and second MR data are read out. Both the step of reading out the first MR data and the step of reading out the second MR data are thereby repeated multiple times for different values of the at least one phase coding gradient.

The further method according to the invention thus likewise includes the three variants (no phase coding gradient, exactly one phase coding gradient and two phase coding gradients) listed for the first method described according to the invention. The explanations described for the three variants with regard to the positive and negative maximum separation, and with regard to the duration and precision, accordingly apply to the further method according to the invention.

For example, the resonance frequency deviation $\Delta f$ can be determined with the use of the following Equation (2):

$$\Delta f = \frac{\gamma}{2\pi} \times (dz_1 - dz_2) \times \frac{G_{R,1} \times G_{R,2}}{G_{R,2} - G_{R,1}} \qquad (2)$$

wherein $\gamma$ is the gyromagnetic ratio, $dz_1$ is the first maximum separation, $dz_2$ is the second maximum separation, $G_{R,1}$ is the amplitude of the first readout gradient and $G_{R,2}$ is the amplitude of the second readout gradient. If $dz_1$ or $dz_2$ is positive, there is a positive maximum separation, and otherwise there is a negative maximum separation.

As a combination of the two methods according to the invention, the polarity of the slice selection gradient can advantageously be chosen to be different than the polarity of the first readout gradient and/or the polarity of the second readout gradient.

However, it is also possible for the polarity of the first readout gradient and the polarity of the second readout gradient to be different.

For both methods according to the invention, a spin echo sequence or a turbo spin echo sequence can be used to determine the resonance frequency deviation.

A basis for Equation (2) is as follows.

If an imprecision $\delta$ is considered with regard to the slice thickness $z_{exc}$ of the slice to be excited, the resonance frequency deviation $\Delta f$ can be determined by the following Equation (3):

$$\Delta f = \frac{\gamma}{2\pi} \times (\delta - dz) \times (G_S^{-1} - G_R^{-1})^{-1}, \qquad (3)$$

wherein $$\delta \in \left[-\frac{z_{exc}}{2}, \frac{z_{exc}}{2}\right].$$

The case of no resonance frequency deviation $\Delta f$ being calculated occurs not only in the event that no slice distortion is present, but also when the following Equation (4) is satisfied $$G_S^{-1} - G_R^{-1} = \frac{\gamma}{2\pi} \times \frac{\delta}{\Delta f} \qquad (4)$$

However, if the slice selection gradient $G_S$ and the readout gradient $G_R$ have different polarity, the case of ambiguity given an undistorted slice profile is precluded since in this event the distortion of the slice profile by the slice selection gradient $G_S$ and by the readout gradient $G_R$ takes place in the same spatial direction.

If the maximum distance dz is determined twice with respective, different readout gradients $G_{R,1}$, $G_{R,2}$, wherein the amplitudes of the two readout gradients $G_{R,1}$, $G_{R,2}$ are selected to be different, the imprecision can be eliminated from Equation (3), from which Equation (2) described in the preceding results.

The methods according to the invention to determine a resonance frequency deviation advantageously yield the result that the resonance frequency deviation $\Delta f=0$ only for the case that the maximum separation dz=0.

The present invention also encompasses a method to create an MR image of a slice of a volume segment within an examination subject with the use of a magnetic resonance system. The method includes the following steps.

A slice selection gradient is activated along a first direction.

An RF excitation pulse is radiated to excite nuclear spins in the slice.

An RF refocusing pulse is radiated in order to refocus dephased spins during activation of the slice selection gradient.

A phase coding gradient is activated along the first direction.

A readout gradient is activated along a second direction that is orthogonal to the first direction.

MR data are read out while the readout gradient is activated.

An MR image is reconstructed from the acquired MR data.

The number of phase coding steps that are achieved by different settings of the phase coding gradient is determined depending on the resonance frequency deviation of the slice, and this resonance frequency deviation is determined with either method according to the invention as described above.

Expressed differently according to the invention, to create the MR image the MR data are not only acquired in the actual slice; but MR data are also acquired within multiple slices situated in parallel to the actual slice. In which slices the MR data are acquired is determined by the phase coding gradient, which is activated along the first direction. The number of additional parallel slices that must be acquired depends in turn on the size of the resonance frequency deviation of the actual slice, which has been determined according to the invention.

In the method according to the invention to create an MR image, accordingly only as many parallel slices are scanned as is required based on the dimension of the distortions of the actual slice which is determined with the use of the resonance frequency deviation. Because the phase coding steps can be optimally adapted individually for each slice in the slice selection direction, the measurement time of the method according to the invention to generate an MR image can be significantly shortened relative to the prior art.

An additional phase coding gradient activated along a third direction that is orthogonal to the first direction and the second direction can optionally be used for spatial coding.

If the distortions of the actual slice can occur both in the first direction and in the direction opposite the first direction (i.e. positive or negative), the number of phase coding steps is determined in a preferred embodiment of the invention depending on a first (normally positive) resonance frequency deviation—which represents the maximum (positive) distortion in the first direction—and depending on a second (normally negative) resonance frequency deviation—which represents the maximum (negative) distortion in the direction opposite the first direction. The first resonance frequency deviation is thereby determined depending on the (positive) maximum separation in the first direction, while the second resonance frequency deviation is determined depending on the (negative) maximum separation in the direction opposite the first direction.

In particular, a spin echo sequence or a turbo spin echo sequence is used to create the MR image according to the invention.

According to this embodiment, in addition to the actual slice parallel slices are scanned, which are separated from the actual slice in the first direction, and parallel slices are scanned which are separated from the actual slice in the direction opposite the first direction. This ensures that—even when the excited actual slice has both positive distortions and negative distortions—the complete information of the actual slice is acquired.

According to the invention, it is possible to read out the MR data by acquiring (entering data into) multiple k-space lines after an RF excitation pulse, as is the case in the turbo spin echo sequence, for example. For this purpose, a loop that includes the radiation of the RF refocusing pulse as well as the readout of the MR data during activation of the readout gradient run through multiple times. In this case, a gradient rephasing the phase coding gradient is after the readout gradient and before the next RF refocusing pulse. This applies both for the method according to the invention to determine the resonance frequency deviation and the method according to the invention to produce an MR image.

In addition to the method according to the invention as described above for production of an MR image, the determination of the resonance frequency deviation according to the invention can also be used for an additional method to produce an MR image in order to optimize the workflow of this additional method. In this additional method, a non-frequency-selective RF excitation pulse is radiated (meaning that the additional method operates without a slice selection gradient), and phase coding gradients are activated for spatial coding and MR data are acquired while a readout gradient is activated. For example, the additional method can be realized using a three-dimensional fast spin echo sequence. Given an existing resonance frequency deviation, however, it is not possible to operate with only one carrier frequency of the non-frequency-selective RF excitation pulse in order to achieve an artifact-free three-dimensional MR image. Instead, k-space is scanned multiple times, with the RF excitation pulse being radiated with different carrier frequencies and the carrier frequency is shifted by a respective difference frequency (for example 2 kHz) from one scan of k-space to the following scan of k-space. The three-dimensional MR image is then reconstructed from the MR data acquired in these different scans of k-space. The respective scanning of k-space can also be designated as an off-resonance acquisition. The number of necessary off-resonance acquisitions is dependent on the positive and negative resonance frequency deviations that are detected in this manner.

For example, if the positive resonance frequency deviation that is detected according to the invention is +6 kHz and the negative resonance frequency deviation that is detected according to the invention is −2 kHz, given a difference frequency of 2 kHz five acquisitions must be implemented, wherein the carrier frequency of the non-frequency-selective RF excitation pulse for these five acquisitions is shifted by −2, 0, 2, 4 and 6 kHz.

The present invention also encompasses a magnetic resonance system to determine a resonance frequency deviation of a slice of a volume segment within an examination subject. The magnetic resonance system has a basic field magnet, a gradient field system, at least one RF antenna, and a control device to control the gradient field system and the at least one RF antenna, to receive measurement signals acquired by the RF antenna(s), and to reconstruct the MR image. The control unit is configured to operate the magnetic resonance system as follows.

A slice selection gradient is activated along one direction by the gradient field system.

An RF excitation pulse is radiated in order to excite nuclear spins in the slice with at least one RF antenna.

An RF refocusing pulse is radiated by the at least one RF antenna in order to refocus dephasing spins for echo formation.

A readout gradient is activated along the direction of the slice selection gradient by the gradient field system.

MR data are read out while the readout gradient is switched.

Image points in an MR image reconstructed are identified using the MR data in order to determine one of these image points that exhibits a maximum separation from the slice, corresponding to the direction of the slice selection gradient.

The resonance frequency deviation is determined depending on the amplitude of the slice selection gradient, the amplitude of the readout gradient and the maximum distance.

The magnetic resonance system is thereby designed such that the slice selection gradient and the readout gradient respectively have an opposite polarity.

The advantages of the magnetic resonance system essentially correspond to the advantages of the first described method according to the invention as described listed in detail above.

The present invention also encompasses, an additional magnetic resonance system to determine a resonance frequency deviation of a slice of a volume segment within an examination subject. The additional magnetic resonance system likewise has a basic field magnet, a gradient field system, at least one RF antenna, and a control device to control the gradient field system and the at least one RF antenna, to receive measurement signals acquired by the RF antenna(s), and to reconstruct an MR image. The magnetic resonance system is designed such that the control unit operates the magnetic resonance system as follows.

A slice selection gradient is activated along one direction with the gradient field system.

An RF excitation pulse is radiated in order to excite nuclear spins in the slice with the at least one RF antenna.

An RF refocusing pulse is radiated with the at least one RF antenna in order to refocus dephasing spins.

A first readout gradient is activated along the direction of the slice selection gradient with the gradient field system.

First MR data are read out while the first readout gradient is activated.

Image points within an MR image reconstructed using the first MR data are located in order to determine one of these image points that exhibits a first maximum separation between itself and the slice, corresponding to the direction of the slice selection gradient.

A second readout gradient is activated along the direction of the slice selection gradient with the gradient field system.

Second MR data are read out while the second readout gradient is activated.

Image points within an MR image reconstructed using the second MR data are located in order to determine one of these image points that exhibits a second maximum separation between itself and the slice, corresponding to the direction of the slice selection gradient.

The resonance frequency deviation is determined depending on the amplitude of the slice selection gradient, the amplitude of the readout gradient, the first maximum distance and the second maximum distance.

The advantages of the additional magnetic resonance system in turn correspond to the advantages of the additional method described in detail above.

The present invention also encompasses a magnetic resonance system to generate an MR image of a slice of a volume segment within an examination subject. The additional magnetic resonance system has a basic field magnet, a gradient field system, at least one RF antenna, and a control device to control the gradient field system and the at least one RF antenna, to receive measurement signals acquired by the RF antenna(s), and to generate an MR image. The control unit operates the magnetic resonance system as follows.

A slice selection gradient is activated along a first direction.

An RF excitation pulse is radiated in order to excite nuclear spins in the slice.

A phase coding gradient is activated along the first direction.

A readout gradient is activated along a second direction, which is orthogonal to the first direction.

MR data are read out while the readout gradient is activated.

An MR image is reconstructed from the MR data.

The magnetic resonance system is thereby designed in order to determine a number of phase coding steps depending on a resonance frequency deviation of the slice, wherein the magnetic resonance system determines the resonance frequency deviation by executing a method according to the invention as described above.

The advantages of the magnetic resonance system according to the invention correspond to the advantages of the corresponding method according to the invention described above.

Furthermore, the present invention encompasses a non-transitory, computer-readable storage medium that can be loaded into a memory of a programmable control device or a computer of a magnetic resonance system. The storage medium is encoded with programming instructions that cause all or various embodiments of the method according to the invention that are described in the preceding to be executed by the control device. The programming instructions may require program means (for example libraries and auxiliary functions) in order to realize the corresponding embodiments of the method. The programming instructions can be in source code (C++, for example) that still needs to be compiled and linked or that only needs to be interpreted, or can be in the form of executable software code that has only to be loaded into the computer or control device for execution.

The electronically readable data storage medium can be, for example, a DVD, a magnetic tape or a USB stick on which electronically readable control information, is stored.

The present invention is particularly suitable for creating MR images of a volume segment in which at least one metallic implant is located. Naturally, the present invention is not limited to this preferred field of application since the present invention can also be used even if no metallic implant is located in the volume segment, but inhomogeneities of the basic magnetic field occur for other reasons, for example.

BRIEF DESCRIPTION OF THE DRAWINGS

FIG. 3 shows a shift of the slice due to the slice selection gradient, while

FIG. 6 depicts a sequence diagram according to the invention for creation of an MR image.

FIG. 7 shows the optimal number of phase coding steps for acquisition of MR data according to the invention.

FIG. 8 depicts a flowchart of a first method according to the invention for determination of the resonance frequency deviation.

FIG. 10 depicts a flowchart of a first method according to the invention for creation of an MR image.

DESCRIPTION OF THE PREFERRED EMBODIMENTS

Figure 1:
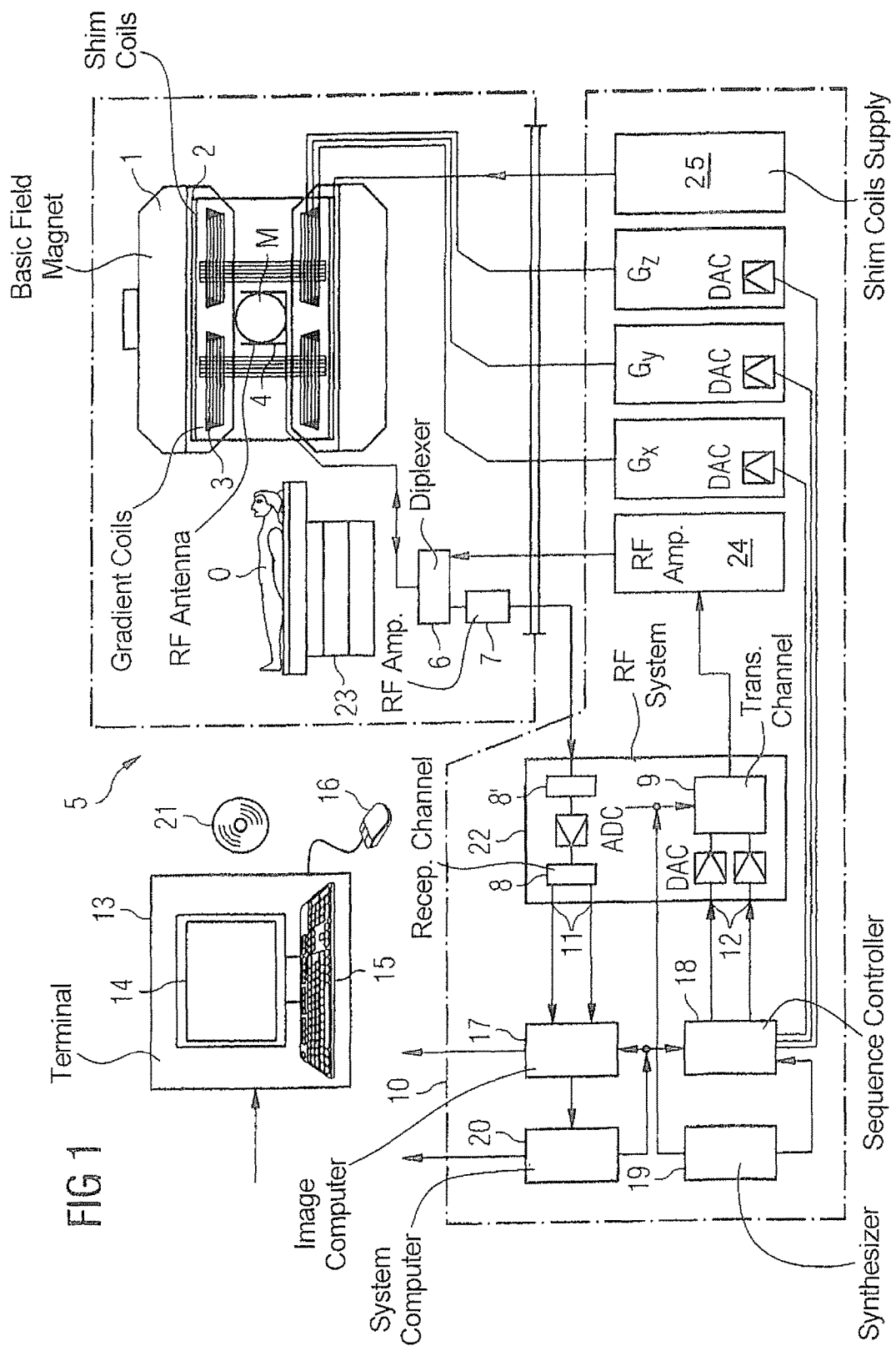
FIG. 1 depicts a magnetic resonance system according to the invention.

FIG. 1 is a schematic depiction of a magnetic resonance system 5 (of a magnetic resonance or, respectively, nuclear magnetic resonance tomography apparatus). A basic field magnet 1 thereby generates a temporally constant, strong magnetic field for polarization or alignment of the nuclear spins in a volume segment of a subject O, for example of a part of a human body O that is to be examined. The body O lies on a table 23 and is examined in the magnetic resonance system 5. The high homogeneity of the basic magnetic field that is required for the nuclear magnetic resonance measurement is defined in a typically spherical measurement volume M in which the parts of the human body that are to be examined are arranged. Shim plates made of ferromagnetic material are attached at suitable points to assist the homogeneity requirements, and in particular to eliminate temporally invariable influences. Temporally variable influences are counteracted by shim coils 2 fed by a shim coils supply 25.

A cylindrical gradient coil system 3 composed of three sub-windings is situated in the basic field magnet 1. Each sub-winding is supplied with current by an amplifier to generate a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each amplifier includes a digital/analog converter that is activated by a sequence controller 18 for accurately-timed generation of gradient pulses.

One or more radio-frequency antennas 4 are provided. The antenna or antennas 4 convert the radio-frequency pulses emitted by a radio-frequency power amplifier 24 into an alternating magnetic field for excitation of the nuclei and alignment of the nuclear spins of the subject O to be examined or of the region of the subject O that is to be examined. The antenna or antennas 4 may also detect an MR signal, resulting from such excitation. The antenna or antennas 4 is/are situated within the gradient field system 3. Each radio-frequency antenna 4 is composed of one or more RF transmission coils and one or more RF reception coils in the form of an annular (advantageously linear or matrix-like) arrangement of component coils. The alternating field emanating from the precessing nuclear spins normally a nuclear spin echo signals caused by a pulse sequence composed of one or more radio-frequency pulses and one or more gradient pulses is also converted by the RF reception coils of the respective radio-frequency antenna 4 into a voltage (measurement signal), which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system 22 via respective inputs 12, and from said digital/analog converter to a transmission channel 9. In the transmission channel 9, the pulse sequences are modulated on a radio-frequency carrier signal whose base frequency corresponds to the center frequency.

The switching from transmission operation to reception operation takes place via a transmission/reception diplexer 6. The RF transmission coils of the radio-frequency antenna(s) 4 radiate(s) the radio-frequency pulses (resonant and non-resonant) for excitation of the nuclear spins and to generate the B1 magnetic field in the measurement volume M, and resulting echo signals are scanned via the RF reception coils. The acquired nuclear magnetic resonance signals are phase-sensitively demodulated to an intermediate frequency in a reception channel 8' (first demodulator) of the radio-frequency system 22 and digitized in an analog/digital converter (ADC). This signal is further demodulated to a frequency of zero. The demodulation to a frequency of zero and the separation into real part and imaginary part occurs in a second demodulator 8 after the digitization in the digital domain. An MR image or three-dimensional image data set is reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 controls the accurately-timed switching (activation) of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR angiography image and the presentation of the generated MR image take place via a terminal 13, which includes a keyboard 15, a mouse 16 and a monitor 14.

Figure 2:
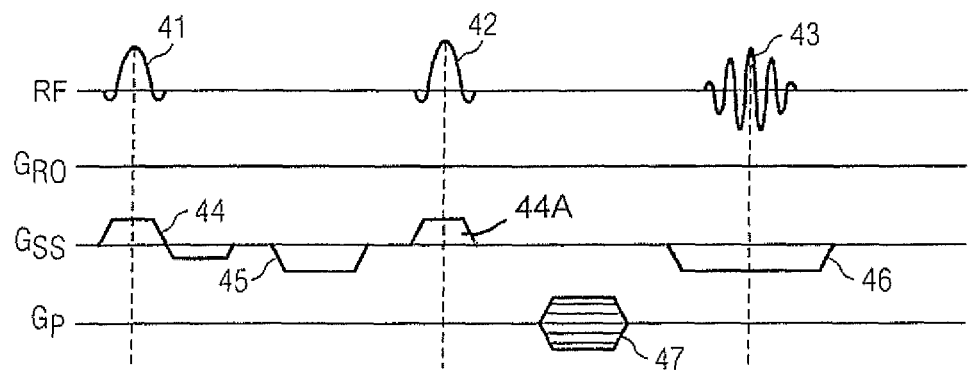
FIG. 2 depicts a sequence diagram according to the invention for the determination of the resonance frequency deviation.

A first sequence according to the invention for the determination of a resonance frequency deviation is depicted in FIG. 2.

An RF excitation pulse 41 is radiated together with a slice selection gradient 44 in order to excite a defined slice. A dephasing gradient 45 is subsequently applied before the refocusing pulse 42 is applied together with an additional gradient 44A. After a phase coding gradient 47 has been applied for spatial coding, a readout gradient 46 is applied with which measurement signals 43 are acquired.

In the event that multiple measurement signals 43 are acquired for the same RF excitation pulse 41, after the readout gradient 46 a gradient rephasing the phase coding gradient 47 is activated. Following in turn after this rephasing gradient are a refocusing pulse 42, a phase coding gradient 47 and the acquisition of the next measurement signal 43 given a switched readout gradient 46. This partial sequence—which includes the refocusing pulse 42, the phase coding gradient 47, the readout gradient 46 (to acquire the measurement signal 43) and the rephasing gradient—can be repeated multiple times before an additional echo train is introduced to radiate an additional RF excitation pulse 41.

The distinctive feature of the sequence diagram shown in FIG. 2 is that the readout gradient 46 is applied in the slice selection direction (thus in the same direction as the slice selection gradient 44), and that the slice selection gradient 44 and the readout gradient 46 have a different polarity.

Figure 3:
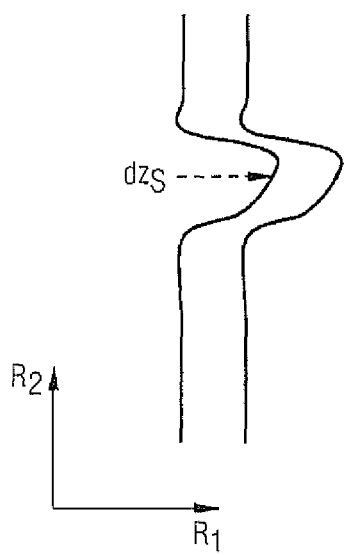
Figure 4:
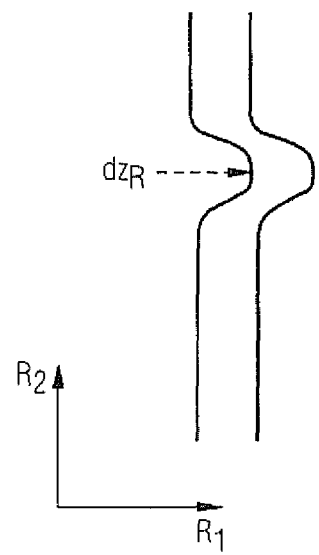
FIG. 4 depicts a shift of the slice due to the readout gradient.

Due to the different polarity of the slice selection gradient 44 and the readout gradient 46, the excited slice is distorted or shifted due to the slice selection gradient 44 and due to the readout gradient 46 in the same direction, as depicted in FIGS. 3a and 3b. In those figures, $dz_S$ depicts the shift of the slice due to the slice selection gradient 44, and $dZ_R$ depicts the shift of the slice due to the readout gradient 46.

Figure 5:
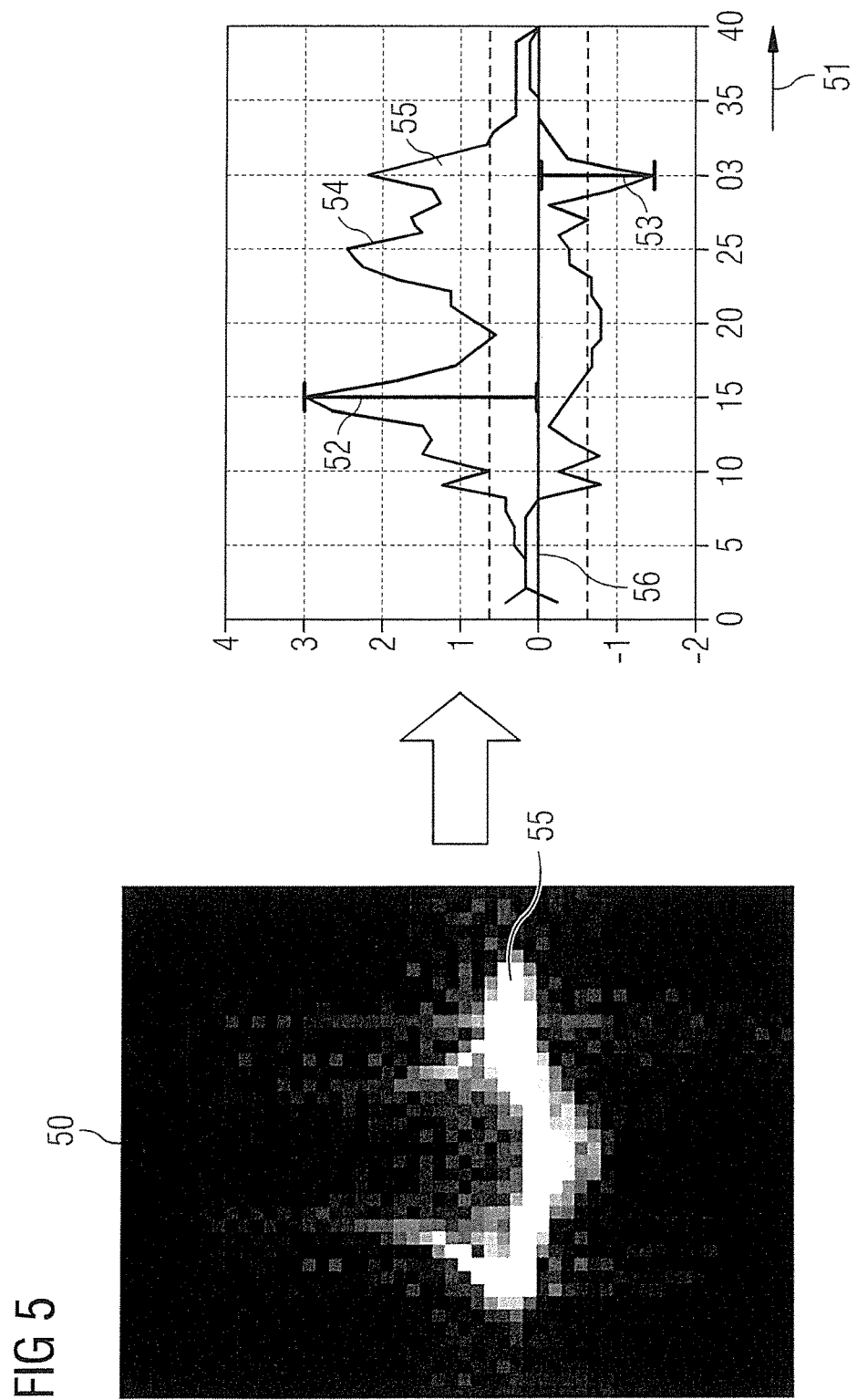
FIG. 5 depicts an MR image acquired with the sequence shown in FIG. 2, together with the determination of the positive and negative maximum separation from this MR image.

If the sequence shown in FIG. 2 is implemented for 40 different settings of the phase coding gradients 47 (i.e. for 40 phase coding steps 51), the MR image 50 shown to the left in FIG. 5 can be reconstructed from the acquired measurement signals 43 or MR data. This MR image 50 has been reconstructed from MR data that have been acquired in a slice that is orthogonal to the actual excited slice. The white region 55 in the MR image 50 corresponds to image points that have a signal intensity that is greater than the predetermined threshold.

Given a stable basic magnetic field, the MR image would show a white rectangle whose thickness would correspond to the slice thickness of the actual excited slice. However, the actual excited slice distorts or shifts due to instabilities of the basic magnetic field, such that the MR image 50 shown in FIG. 5 is created. By defined methods, the contour 54 of the white region 55 can now be determined from this MR image 50, and from this contour 54 the positive maximum separation 52 and the negative maximum separation 53 can respectively be determined from a contour point or, respectively, image point at the slice.

The positive maximum separation 52 is accordingly defined by that image point which is separated a maximum distance from the slice in the direction of the slice selection gradient 44, which is designated as the zero axis 56 in FIG. 5. The negative maximum separation 53 is accordingly defined by that image point that is separated a maximum distance from the slice in the direction opposite the slice selection gradient 44 (below in FIG. 5).

For example, with the use of Equation (1) described in the preceding the resonance frequency deviation can be determined depending on the respective maximum separation 52, 53 (normally positive or negative). Using this resonance frequency deviation—or better using the normally positive or negative resonance frequency deviation—the minimum necessary number of phase coding steps 33 can be determined that are necessary in order acquire additional parallel slices (i.e. slices that are parallel to the actual slice) in addition to the actual slice, in order to acquire all information of this slice in spite of the distortions of the actual slice.

A sequence diagram to generate an MR image of the actual slice is depicted in FIG. 6.

Similar to the sequence diagram depicted in FIG. 2, the slice is excited with an RF excitation pulse 41 while the slice selection gradient 44 is activated. For spatial coding of the parallel slices, a phase coding gradient 35 exists in the slice selection direction is activated simultaneously with the phase coding gradient 38, which, is activated in a direction orthogonal to the slice selection direction. In this sequence, the readout gradient 37 proceeds in a direction that is both orthogonal to the slice selection direction and orthogonal to the direction of the phase coding gradient 38.

In the sequence depicted in FIG. 6, it is also possible to acquire multiple measurement signals with the same RF excitation pulse 41. In this case, for gradient rephasing the phase coding gradient 46 must be activated in turn after the readout gradient 37, before an additional measurement signal is acquired with the use of the partial sequence that includes the refocusing pulse 42, the phase coding gradients 35 and 38, and the readout gradient 47.

FIG. 7 depicts those slices in which MR data are acquired in order to read out all information within the excited, distorted slice. The slice thickness of the actual slice is designated with the reference character $z_{exc}$. If the basic magnetic field were truly homogenous, only the slice corresponding to the slice $z_{exc}$ would be excited, such that only MR data within this slice would need to be read out. However, due to the distortions (which, in FIG. 7, do not correspond to the distortions of FIG. 5) additional slices must be read out (by means of additional phase coding steps 33) in order to acquire the entire information of the actual excited slice.

The number of parallel slices (and the number of phase coding steps 33 required for these) which must be scanned due to a (positive) distortion 31 of the slice in the slice selection direction (at the top in FIG. 7) is determined depending on the positive resonance frequency deviation. The number of parallel slices (and the number of phase coding steps 33 required for these) which must be scanned due to a (negative) distortion 32 of the slice in the direction opposite the slice selection direction is similarly determined depending on the negative resonance frequency deviation.

A flowchart of a method according to the invention to determine the off-resonance frequency or, respectively, resonance frequency deviation is depicted in FIG. 8.

In a first step S1, a slice selection gradient 44 is activated along a first direction $R_1$, and the slice is excited with an RF excitation pulse 41 in the second step s2. In the following step S3, a refocusing pulse 42 is activated which is followed by the activation of a phase coding gradient 47 along a second direction $R_2$, which is orthogonal to the first direction $R_1$. A readout gradient 46 is activated along the first direction $R_1$ (slice selection direction) to read out the MR data in step S6. The steps S3 through S6 can be repeated multiple times. The slice selection gradient 44 thereby has a polarity opposite that of the readout gradient 46.

The steps S1 through S6 are repeated until all MR data of a slice which is orthogonal to the actual slice have been read out. However, it is also possible for the MR data to be acquired with only one echo train, thus by the activation of only one RF excitation pulse 41 and correspondingly many passes through (executions of) steps S3 through S6. The number of passes thereby corresponds to the number of phase coding steps that are necessary.

The (positive) maximum separation is then determined in step S7 depending on the MR data. For this, an MR image in which that image point which is furthest distant from the excited slice in the slice selection direction $R_1$ is normally determined from the MR data. For example, the positive maximum resonance frequency deviation is then determined with the aid of Equation (1) described in the preceding, depending on this maximum separation.

If it is expected that the excited slice is also shifted or distorted in the direction opposite the slice selection direction $R_1$, in step S7 the maximum negative separation can also be determined in addition to the maximum positive separation, which maximum negative separation is determined using that image point which is furthest distant from the excited slice in the direction opposite the slice selection direction $R_1$.

It is noted that, for the case that the loop composed of steps S3 through S6 is traversed again after the readout of the MR data (step S6), the rephasing gradient described in the preceding is activated between the step S6 and step S3.

Figure 9:
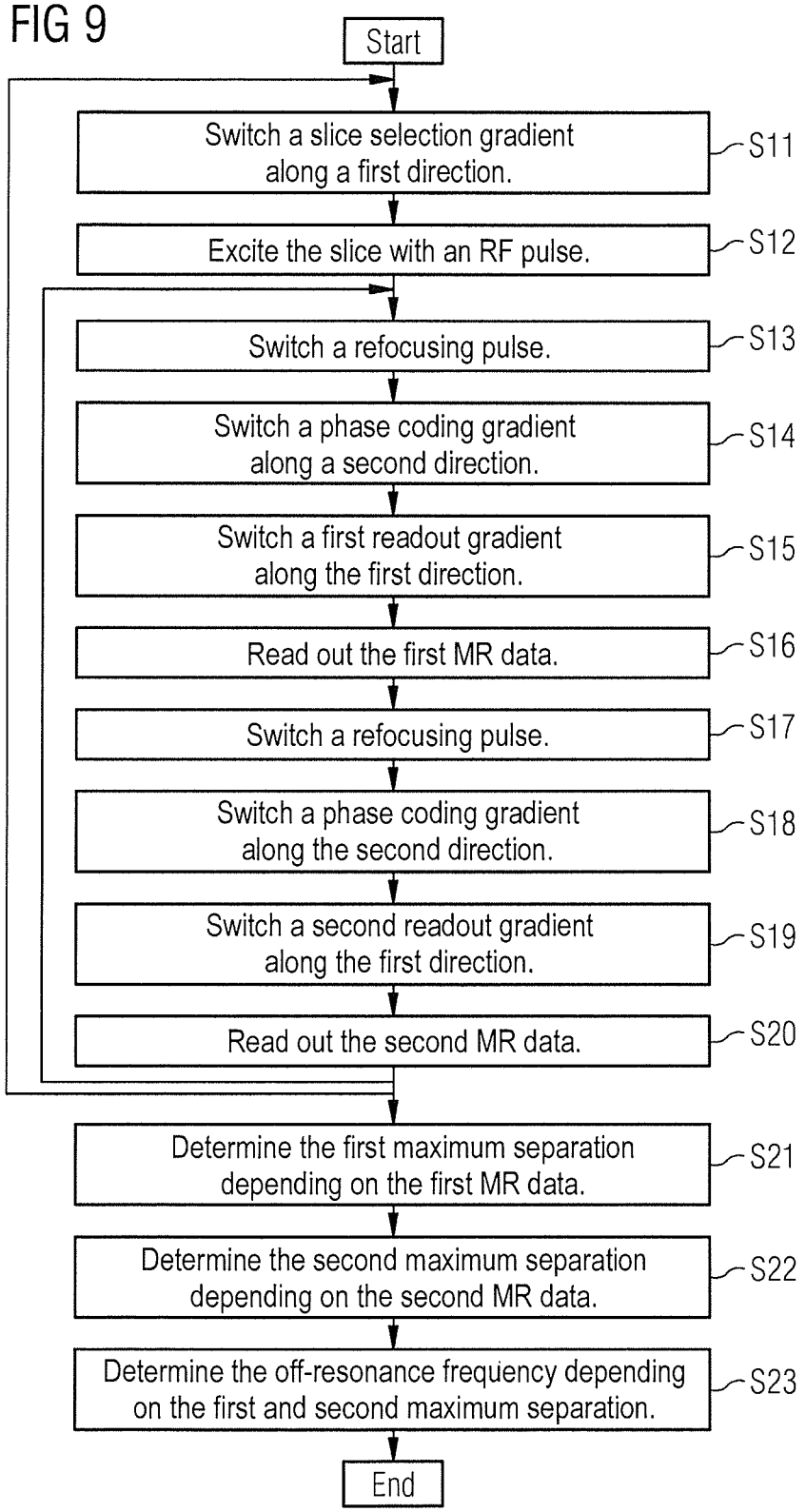
FIG. 9 depicts a flowchart of a second method according to the invention for determination of the resonance frequency deviation.

A flowchart of an additional method according to the invention to determine the resonance frequency deviation is depicted in FIG. 9.

In the first two steps S11 and S21, a slice selection gradient 41 is activated along a first direction, or slice selection direction, $R_1$ and the slice is excited with an RF excitation pulse 41.

In step S13 a refocusing pulse 42 is activated, wherein a phase coding gradient 47 for spatial coding is subsequently switched in step S14 along a second direction $R_2$ orthogonal to the first direction $R_1$. In step S15, a first readout gradient is subsequent switched in the first direction $R_1$ in order to subsequently read out first MR data in step S16. After a refocusing pulse is activated again in step S17 and the phase coding gradient is switched in step S18, in step S19 a second readout gradient is activated (with a strength that is different from that of the first readout gradient) in order to read out second MR data in step S20.

Steps S13 through S20 can be repeated multiple times. The slice selection gradient has a polarity opposite that of the first readout gradient and the same as that of the second readout gradient.

Steps S11 through S20 are repeated until all first and second MR data of a slice which is orthogonal to the actual slice have been read out. However, it is also possible for the first and second MR data to be acquired with only one echo train, thus by activating only one RF excitation pulse and correspondingly many passes of steps S13 through S20. The number of passes thereby corresponds to the number of necessary phase coding steps.

While a first maximum separation is determined depending on the first MR data in step S21, in step S22 a second maximum separation is determined depending on the second MR data. The determination of the first or second maximum separation corresponds in principle to the determination of the maximum separation in the method according to the invention as described in the preceding with FIG. 8. In other words: a first MR image is typically created using the first MR data and a second MR image is typically created using the second MR data, wherein the first maximum separation is determined in the manner described above with the aid of the first MR image and the second maximum separation is determined in the manner described above with the aid of the second MR image.

In a manner similar to as described for the method depicted in FIG. 8, in step S21 (S22) both a first (second) maximum positive separation and a first (second) maximum negative separation are determined depending on the first (second) MR data. In this case, in step S23 a first (normally positive) resonance frequency deviation is determined depending on the first and second maximum positive separation, and a second (normally negative) resonance frequency deviation is determined depending on the first and second maximum negative separation.

It is noted that the rephasing gradient described in the preceding is to be switched between the readout of the first MR data (step S16) and the activation of a refocusing pulse (step S17). Moreover, in the event that the loop composed of steps S13 through S20 is run through again after the readout of the second MR data (step S20), the rephasing gradient described in the preceding is likewise activated between step S20 and step S13.

A flowchart of a method according to the invention for creation of an MR image is depicted in FIG. 10.

A slice selection gradient 44 is activated along the first direction $R_1$ (see step S31) and the slice is excited with an RF pulse 41 (see step S32). Subsequently, a refocusing pulse is activated (step S33), a first phase coding gradient 35 is activated along the first direction $R_1$ and a second phase coding gradient is activated along the second direction $R_2$ before a readout gradient 37 is activated in step S36 along a third direction (orthogonal to the first direction $R_1$ and the second direction $R_2$) in order to read out MR data in step S37.

Steps S33 through S37 can be implemented multiple times. The steps S31 through S37 are implemented until the MR data have been acquired both from the actual excited slice and from the necessary parallel slices. In step S38, the MR image of the actual excited slice is then reconstructed using these MR data.

It is noted that when the loop composed of steps S33 through S37 is traversed again after the readout of the MR data (step S37), the rephasing gradient described in the preceding is activated between step S37 and step S33.

In this method according to the invention, those parallel slices that are acquired in order to acquire the entire information of the actual excited slice are determined with the first phase coding gradient along the slice selection direction $R_1$. This determination is dependent on the resonance frequency deviation or resonance frequency deviations that is/are determined by a method according to the invention as described above.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to determine an actual measurement of a resonance frequency deviation in a magnetic resonance (MR) apparatus, comprising:

operating a gradient system of the MR apparatus in order to activate a slice selection gradient along a direction, said slice selection gradient having an amplitude and a polarity;

operating a radio-frequency (RF) antenna system of the MR apparatus in order to radiate an excitation pulse into an examination subject, situated in the MR apparatus and thereby excite nuclear spins in a slice in the examination subject defined by the slice selection gradient;

operating the RF antenna system in order to radiate a RF refocusing pulse which refocuses dephased nuclear spins in the examination subject;

operating the gradient system in order to activate a readout gradient along said slice selection direction, said readout gradient that is being activated along the slice selection direction having an amplitude, and a polarity that is opposite to the polarity of the activated slice selection gradient;

operating the RF antenna system in order to readout MR data while the readout gradient is activated along the slice selection direction;

providing the readout MR data to a processor and, in said processor, reconstructing an MR image from the provided, and readout MR data;

identifying image points in said reconstructed MR mage exhibiting a signal intensity that is greater than a predetermined threshold;

determining one image point, among the image points identified in said reconstructed MR image, that has a maximum separation between said determined one image point and said slice of the examination subject, occurring along said same direction as the activated slice selection and readout gradients; and in said processor, determining an actual measurement of a resonance frequency deviation dependent on said amplitude of the slice selection gradient, said amplitude of the readout gradient, and said maximum separation, and thereafter emitting an electronic signal from said processor representing said actual measurement of said resonance frequency deviation which is then provided to a user, output to a monitor display, or stored in a memory.

2. A method as claimed in claim 1, comprising:
operating said gradient system in order to activate at least one phase coding gradient in at least one additional direction orthogonal to said direction of the activated slice-selection and readout gradients; and
repeating reading out said MR data multiple times and, in each repetition, activating said phase coding gradient with a respectively different amplitude.

3. A method as claimed in claim 1 comprising determining an actual measurement of said resonance frequency deviation $\Delta f$ according to: $\Delta f = \gamma/2\pi \times dz \times (GR^{-1} \, GS^{-1})^{-1}$
wherein $\gamma$ is the gyromagnetic ratio, dz is the maximum separation, GR is the amplitude of the readout gradient, and GS is the amplitude of the slice selection gradient.

4. A method to determine an actual measurement of said resonance frequency deviation in a magnetic resonance (MR) apparatus, comprising:
operating a gradient system of the MR apparatus in order to activate a slice selection gradient along a direction;
operating a radio-frequency (RF) antenna system of the MR apparatus in order to radiate an RF excitation pulse into an examination subject situated in the MR apparatus, and thereby excite nuclear spins in a slice of the examination subject defined by the slice selection gradient;
operating the gradient system in order to activate a first readout gradient along said slice selection direction;
operating the RF antenna system in order to read out first MR data from the examination subject while the first readout gradient is activated along the slice selection direction;
providing said readout first MR data to a processor and, in said processor,
reconstructing a first MR image from the readout first MR data;
identifying image points in said reconstructed first MR image that exhibit a signal intensity that is greater than a predetermined threshold; and
determining one image point, among the image points identified in said reconstructed first MR image, that has a first maximum separation between said determined one image point in said reconstructed first MR image and said slice of the examination subject, along said direction of the activated slice-selection and readout gradients;
operating said gradient system in order to activate a second readout gradient along said direction of the slice-selection gradient;
operating the RF antenna system in order to read out second MR data from the examination subject while the second readout gradient is activated along the slice selection direction;
providing said readout second MR data to said processor and,
in said processor,
reconstructing a second MR image from said readout second MR data; and
identifying image points in said reconstructed second MR image that exhibit a signal intensity that is greater than said predetermined threshold; and
determining one image point, from among the identified image points in said reconstructed second MR image, that has a second maximum separation between said determined one image point in said reconstructed second MR image and said slice of the examination subject, along said same direction as the activated slice-selection and readout gradients;
determining said actual measurement of said resonance frequency deviation dependent on said first maximum separation, said second maximum separation, an amplitude of the first readout gradient, and an amplitude of the second readout gradient, and
thereafter emitting an electronic signal from said processor that corresponds to the actual measurement of said determined resonance frequency deviation which is then provided to a user, output to a monitor display, or stored in a memory.

5. A method as claimed in claim 4 comprising:
operating the gradient system in order to activate at least one phase coding gradient in at least one additional direction that is orthogonal to said direction of the activated slice-selection and readout gradients, before reading out said first MR data and said second MR data; and
repeatedly reading out said first MR data and repeatedly reading out said second MR data multiple times and, in each repetition of readout of said first MR data and readout of said second MR data, activating said phase coding gradient with a respectively different amplitude.

6. A method as claimed in claim 4 comprising determining said actual measurement of said resonance frequency deviation $\Delta f$ according to:
$\gamma$ is the gyromagnetic ratio, dz1 is the first maximum separation, dz2 is the second maximum separation, GR,1 is the amplitude of the first readout gradient and GR,2 is the amplitude of the second readout gradient.

7. A method as claimed in claim 4 comprising operating said gradient system in order to activate at least one of said first readout gradient and said second readout gradient with a polarity that is different from a polarity of the activated slice selection gradient.

8. A method as claimed in claim 4 comprising operating said gradient system in order to activate said first readout gradient along the slice-selection direction with a polarity that is different from a polarity of said second readout gradient that is also activated along the slice-selection direction.

9. A method of generating a magnetic resonance (MR) image of a slice of an examination subject situated in an MR apparatus, comprising:

operating a gradient system of the MR apparatus in order to activate a slice selection gradient along a direction, said slice selection gradient having an amplitude and a polarity;

operating a radio-frequency (RF) antenna system of the MR apparatus in order to radiate an excitation pulse into an examination subject, situated in the MR apparatus, and thereby excite nuclear spins in a slice in the examination subject defined by the slice selection gradient;

operating the RF antenna system in order to radiate a RF refocusing pulse which refocuses dephased nuclear spins in the examination subject;

operating the gradient system in order to activate a readout gradient along said slice selection direction, said readout gradient that is being activated along the slice selection direction having an amplitude, and a polarity that is opposite to the polarity of the slice selection gradient;

operating the RF antenna system in order to read out MR data while the readout gradient is activated along the slice-selection direction;

providing the readout MR data to a processor and, in said processor, reconstructing an MR image from the readout MR data;

identifying image points in said reconstructed MR image exhibiting a signal intensity that is greater than a predetermined threshold;

determining one image point, among said image points identified in said reconstructed MR image, that has a maximum separation between said determined one image point in said reconstructed MR image and said slice of the examination subject, occurring along said same direction as the activated slice-selection and readout gradients; and determining an actual measurement of said resonance frequency deviation dependent on said amplitude of the slice selection gradient, said amplitude of the readout gradient, and said maximum separation;

operating said gradient system in order to activate another slice selection gradient along said slice-selection direction;

operating the RF antenna system in order to radiate another RF excitation pulse into the examination subject and thereby excite nuclear spins in a slice of the examination subject defined by said another slice selection gradient;

operating said gradient system in order to activate a phase coding gradient a plurality of times along said slice-selection direction, and setting said plurality dependent on the actual measurement of said determined resonance frequency deviation;

operating said gradient system in order to activate a readout gradient along another direction, which is orthogonal to said slice-selection direction;

operating said RF antenna system in order to read out diagnostic MR data while said another readout gradient is activated along said another direction, which is orthogonal to said slice-selection direction; and in said processor, reconstructing a generated diagnostic MR image from said diagnostic MR data which is then provided to a user, output to a monitor display, or stored in a memory.

10. A method as claimed in claim 9, wherein said actual measurement of said resonance frequency deviation is a first resonance frequency deviation, and wherein said processor further determines a second actual measurement of said resonance frequency deviation by determining another one image point, among the identified image points in said reconstructed MR image, that has a maximum separation from said slice of the examination subject in a direction opposite to said slice-selection direction; and determining said plurality of times of activating said phase coding gradient dependent on said first actual measurement of said resonance frequency deviation and said second actual measurement of said resonance frequency deviation.

11. A method of generating a magnetic resonance (MR) image of a slice of an examination subject situated in an MR apparatus, comprising:

operating a gradient system of the MR apparatus in order to activate a slice selection gradient along a direction;

operating a radio-frequency (RF) antenna system of the MR apparatus in order to radiate an excitation pulse into an examination subject, situated in the MR apparatus, and thereby excite nuclear spins in a slice in the examination subject defined by the slice selection gradient;

operating the gradient system in order to activate a first readout gradient along said slice selection direction;

operating the RF antenna system in order to read out first MR data while the readout gradient is activated along the slice-selection direction;

providing the first readout MR data to a processor and, in said processor, reconstructing a first MR image from the first readout MR data;

identifying image points in said reconstructed first MR image that exhibit a signal intensity that is greater than a predetermined threshold;

determining one image point, among the image points identified in said reconstructed first MR image, that has a first maximum separation between said determined one image point and said slice of the examination subject, occurring along said same direction as the activated slice-selection and readout gradients; and operating said gradient system in order to activate a second readout gradient along said direction as the activated slice-selection gradient;

operating the RF antenna system in order to read out second MR data from the examination subject while the second readout gradient is activated along the slice-selection direction;

providing said second readout MR data to a processor and, in said processor, reconstructing a second MR image from the second readout MR data;

identifying image points in said reconstructed second MR image that exhibit a signal intensity that is greater than a predetermined threshold;

determining one image point, from among said image points identified in said reconstructed second MR image, that has a maximum separation between said determined one image point in said reconstructed second MR image and said slice of the examination subject, occurring along said same direction as the activated slice-selection and readout gradients; and
determining an actual measurement of said resonance frequency deviation dependent on said first maximum separation, said second maximum separation, an amplitude of the first readout gradient, and an amplitude of the second readout gradient;
operating said gradient system in order to activate another slice selection gradient along said slice-selection direction;
operating the RF antenna system in order to radiate another RF excitation pulse into the examination subject and thereby excite nuclear spins in a slice of the examination subject defined by said another slice selection gradient occurring along said same direction as the activated slice-selection gradient;
operating said gradient system in order to activate a phase coding gradient a plurality of times along said slice-selection direction, and setting said plurality dependent on said determined actual measurement of resonance frequency deviation;
operating said gradient system in order to activate a readout gradient along another direction, which is orthogonal to said slice-selection direction;
operating said RF antenna system in order to read out diagnostic MR data while said another readout gradient is activated in said another direction which is orthogonal to said slice-selection direction; and
in said processor, reconstructing a diagnostic MR image from said diagnostic MR data which is then provided to a user, output to a monitor display, or stored in a memory.

12. A method as claimed in claim 11, wherein said actual measurement of said resonance frequency deviation is a first resonance frequency deviation, and a second actual measurement of said resonance frequency deviation by determining another one image point, among the identified image points in said reconstructed MR image, that has a maximum separation from said slice of the examination subject in a direction opposite to said slice-selection direction; and
determining said plurality of times of activating said phase coding gradient dependent on said first actual measurement of said resonance frequency deviation and said second actual measurement of said resonance frequency deviation.

13. A magnetic resonance (MR) apparatus comprising:
an MR data acquisition unit comprising a gradient system and a radio-frequency (RF) antenna system;
a control unit configured to operate a gradient system of the MR data acquisition unit in order to activate a slice selection gradient along a direction, said slice selection gradient having an amplitude and a polarity;
said control unit configured to operate the RF antenna system of the MR data acquisition unit in order to radiate an excitation pulse into an examination subject, situated in the MR data acquisition unit, and thereby excite nuclear spins in a slice in the examination subject defined by the slice selection gradient;
said control unit configured to operate the RF antenna system in order to radiate a RF refocusing pulse which refocuses dephased nuclear spins in the examination subject;
said control unit configured to operate the gradient system in order to activate a readout gradient along said slice selection direction, said readout gradient that is being activated along the slice selection direction having an amplitude, and a polarity that is opposite to the polarity of the activated slice selection gradient;
said control unit configured to operate the RF antenna system in order to readout MR data while the readout gradient is activated along the slice selection direction;
a processor provided with the readout MR data, said processor being configured to reconstruct an MR image from the provided, and readout MR data, and configured to identify image points in said reconstructed MR mage exhibiting a signal intensity that is greater than a predetermined threshold, and configured to determine one image point, among said image points identified in said reconstructed MR image, that has a maximum separation between said determined one image point and said slice of the examination subject, occurring along said same direction as the activated slice selection and readout gradients; and
said processor being configured to determine an actual measurement of a resonance frequency deviation dependent on said amplitude of the slice selection gradient, said amplitude of the readout gradient, and said maximum separation, and to thereafter emit an electronic signal representing said actual measurement of said resonance frequency deviation which is then provided to a user, output to a monitor display, or stored in a memory.

14. A magnetic resonance (MR) apparatus comprising:
an MR data acquisition unit comprising a gradient system and a radio-frequency (RF) antenna system;
a control unit configured to operate the gradient system of the MR data acquisition unit in order to activate a slice selection gradient along a direction;
said control unit configured to operate the RF antenna system of the MR data acquisition unit in order to radiate an RF excitation pulse into an examination subject situated in the MR data acquisition unit, and thereby excite nuclear spins in a slice of the examination subject defined by the slice selection gradient;
said control unit configured in order to activate a first readout gradient along said slice selection direction;
said control unit configured to operate the RF antenna system in order to read out first MR data from the examination subject while the first readout gradient is activated along the slice selection direction;
a processor provided with said readout first MR data, said processor being configured to reconstruct a first MR image from the readout first MR data, and configured to identify image points in said reconstructed first MR image that exhibit a signal intensity that is greater than a predetermined threshold, and further configured to determine one image point, among the image points identified in said reconstructed first MR image, that has a first maximum separation between said determined one image point in said reconstructed first MR image and said slice of the examination subject, along said direction of the activated slice-selection and readout gradients;
said control unit configured to operate said gradient system in order to activate a second readout gradient along said direction of the slice-selection gradient;
said control unit configured to operate the RF antenna system in order to read out second MR data from the examination subject while the second readout gradient is activated along the slice selection direction;

said processor being provided with said readout second MR data, and said processor being configured to reconstruct a second MR image from said readout second MR data, and configured to identify image points in said reconstructed second MR image that exhibit a signal intensity that is greater than said predetermined threshold, and further configured to determine one image point, among the identified image points in said reconstructed second MR image, that has a second maximum separation between said determined one image point in said reconstructed second MR image and said slice of the examination subject, along said same direction as the activated slice-selection and readout gradients; and said processor being configured to determine said actual measurement of said resonance frequency deviation dependent on said first maximum separation, said second maximum separation, an amplitude of the first readout gradient, and an amplitude of the second readout gradient, and configured to thereafter emit an electronic signal from said processor that corresponds to the actual measurement of said determined resonance frequency deviation which is then provided to a user, output to a monitor display, or stored in a memory.

15. A magnetic resonance (MR) apparatus comprising:

an MR data acquisition unit comprising a gradient system and a radio-frequency (RF) antenna system;

a control unit configured in order to operate the gradient system of the MR data acquisition unit to activate a slice selection gradient along a direction, said slice selection gradient having an amplitude and a polarity;

said control unit configured in order to operate the RF antenna system of the MR data acquisition unit to radiate an excitation pulse into an examination subject, situated in the MR data acquisition unit and thereby excite nuclear spins in a slice in the examination subject defined by the slice selection gradient;

said control unit configured to operate the RF antenna system in order to radiate a RF refocusing pulse which refocuses dephased nuclear spins in the examination subject;

said control unit configured to operate the gradient system in order to activate a readout gradient along said slice selection direction, said readout gradient that is being activated along the slice selection direction having an amplitude, and a polarity that is opposite to the polarity of the slice selection gradient;

said control unit configured to operate the RF antenna system in order to read out MR data while the readout gradient is activated along the slice-selection direction;

a processor provided with the readout MR data, said processor being configured to reconstruct an MR image from the readout MR data, and configured to identify image points in said reconstructed MR image exhibiting a signal intensity that is greater than a predetermined threshold, and configured to determine one image point, among said image points identified in said reconstructed MR image, that has a maximum separation between said determined one image point in said reconstructed MR image and said slice of the examination subject, occurring along said same direction as the activated slice-selection and readout gradients;

said processor being configured to determine an actual measurement of said resonance frequency deviation dependent on said amplitude of the slice selection gradient, said amplitude of the readout gradient, and said maximum separation;

said control unit configured to operate said gradient system in order to activate another slice selection gradient along said slice-selection direction;

said control unit configured to operate the RF antenna system in order to radiate another RF excitation pulse into the examination subject and thereby and thereby to excite nuclear spins in a slice of the examination subject defined by said another slice selection gradient;

said control unit configured to operate said gradient system in order to activate a phase coding gradient a plurality of times along said slice-selection direction, and setting said plurality dependent on the actual measurement of said determined resonance frequency deviation;

said control unit configured to operate said gradient system in order to activate a readout gradient along another direction, which is orthogonal to said slice-selection direction;

said control unit configured to operate said RF antenna system in order to read out diagnostic MR data while said another readout gradient is activated along said another direction, which is orthogonal to said slice-selection direction; and said processor being configured to reconstruct a generated diagnostic MR image from said diagnostic MR data which is then provided to a user, output to a monitor display, or stored in a memory.

16. A magnetic resonance (MR) apparatus comprising:

an MR data acquisition unit comprising a gradient system and a radio-frequency (RF) antenna system;

a control unit configured to operate the gradient system of the MR data acquisition unit in order to activate a slice selection gradient along a direction;

said control unit configured to operate the RF antenna system of the MR data acquisition unit in order to radiate an RF excitation pulse into an examination subject, situated in the MR data acquisition unit, and thereby excite nuclear spins in a slice of the examination subject defined by the slice selection gradient;

said control unit configured to operate the gradient system in order to activate a first readout gradient along said slice selection direction;

said control unit configured to operate the RF antenna system in order to read out first MR data while the readout gradient is activated along the slice-selection direction;

a processor being provided with said first MR data, and said processor being configured to reconstruct a first MR image from the readout first MR data, and configured to identify image points in said reconstructed first MR image that exhibit a signal intensity that is greater than a predetermined threshold, and further configured to determine one image point, among the image points identified in said reconstructed first MR image, that has a first maximum separation between said determined one image point in said reconstructed first MR image and said slice of the examination subject, occurring along said same direction as the activated slice-selection and readout gradients;

said control unit configured to operate said gradient system in order to activate a second readout gradient along said direction as the activated slice-selection gradient;

said control unit configured to operate the RF antenna system in order to read out second MR data from the examination subject while the second readout gradient is activated along the slice-selection direction;

said processor being provided with said second readout MR data, and said processor being configured to reconstruct a second MR image from said second readout MR data, and configured to identify image points in said reconstructed second MR image that exhibit a signal intensity that is greater than said predetermined threshold, and further configured to determine one image point, among the identified image points in said reconstructed second MR image, that has a second maximum separation between said determined one image point in said reconstructed second MR image and said slice of the examination subject, occurring along said same direction as the activated slice-selection and readout gradients;

said processor being configured to determine an actual measurement of said resonance frequency deviation dependent on said first maximum separation, said second maximum separation, an amplitude of the first readout gradient, and an amplitude of the second readout gradient;

said control unit configured to operate said gradient system in order to activate another slice selection gradient along said slice-selection direction;

said control unit configured to operate the RF antenna system in order to radiate another RF excitation pulse into the examination subject and thereby excite nuclear spins in a slice of the examination subject defined by said another slice selection gradient occurring along said same direction as the activated slice-selection gradient;

said control unit configured to operate said gradient system in order to activate a phase coding gradient a plurality of times along said slice-selection direction, and to set said plurality dependent on said determined actual measurement of said resonance frequency deviation;

said control unit configured to operate said gradient system in order to activate a readout gradient along another direction, which is orthogonal to said slice-selection direction;

said control unit configured to operate said RF antenna system in order to read out diagnostic MR data while said another readout gradient is activated in said another direction which is orthogonal to said slice-selection direction; and said processor being configured to reconstruct a diagnostic MR image from said diagnostic MR data which is then provided to a user, output to a monitor display, or stored in a memory.

17. A non-transitory, computer-readable data storage medium encoded with programming instructions, said storage medium being loaded into a control and processing system of a magnetic resonance (MR) apparatus that comprises a gradient coil system and a radio-frequency (RF) antenna system, said programming instructions causing said control and processing system to:

operate the gradient system of the MR apparatus in order to activate a slice selection gradient along a direction, said slice selection gradient having an amplitude and a polarity;

operate the RF antenna system of the MR apparatus in order to radiate an excitation pulse into an examination subject, situated in the MR apparatus and thereby excite nuclear spins in a slice in the examination subject defined by the slice selection gradient;

operate the RF antenna system in order to radiate a RF refocusing pulse which refocuses dephased nuclear spins in the examination subject;

operate the gradient system in order to activate a readout gradient along said slice selection direction, said readout gradient that is being activated along the slice selection direction having an amplitude, and a polarity that is opposite to the polarity of the activated slice selection gradient;

operate the RF antenna system in order to readout MR data while the readout gradient is activated along the slice selection direction;

reconstruct an MR image from the provided, and readout MR data;

identify image points in said reconstructed MR mage exhibiting a signal intensity that is greater than a predetermined threshold;

determine one image point, among said image points identified in said reconstructed MR image, that has a maximum separation between said determined one image point and said slice of the examination subject, occurring along said same direction as the activated slice selection and readout gradients; and determine an actual measurement of a resonance frequency deviation dependent on said amplitude of the slice selection gradient, said amplitude of the readout gradient, and said maximum separation, and thereafter emitting an electronic signal representing said actual measurement of said resonance frequency deviation which is then provided to a user, output to a monitor display, or stored in a memory.

18. A non-transitory, computer-readable data storage medium encoded with programming instructions, said storage medium being loaded into a control and processing system of a magnetic resonance (MR) apparatus that comprises a gradient coil system and a radio-frequency (RF) antenna system, said programming instructions causing said control and processing system to:

operate the gradient system of the MR apparatus in order to activate a slice selection gradient along a direction;

operate the RF antenna system of the MR apparatus in order to radiate an RF excitation pulse into an examination subject, situated in the MR apparatus, and thereby excite nuclear spins in a slice of the examination subject defined by the slice selection gradient;

operate the gradient system in order to activate a first readout gradient along said slice selection direction;

operate the RF antenna system in order to read out first MR data from the examination subject while the first readout gradient is activated along the slice selection direction;

reconstruct a first MR image from the readout first MR data;

identify image points in said reconstructed MR mage exhibiting a signal intensity that is greater than a predetermined threshold;

determine one image point, among the image points identified in said reconstructed first MR image, that has a first maximum separation between said determined one image point and said slice of the examination subject, along said direction of the activated slice-selection and readout gradients;

operate said gradient system in order to activate a second readout gradient along said direction of the slice-selection gradient;

operate the RF antenna system in order to read out second MR data from the examination subject while the second readout gradient is activated along the slice selection direction;

reconstruct a second MR image from said readout second MR data, and identify image points in said reconstructed second MR image that exhibit a signal intensity that is greater than said predetermined threshold, and determine one image point, among the identified image points in said reconstructed second MR image, that has a second maximum separation between said determined one image point in said reconstructed second MR image and said slice of the examination subject, along said same direction as the activated slice-selection and readout gradients; and determine said actual measurement of said resonance frequency deviation dependent on said first maximum separation, said second maximum separation, an amplitude of the first readout gradient, and an amplitude of the second readout gradient, and thereafter emit an electronic signal from said processor that corresponds to the actual measurement of said determined resonance frequency deviation which is then provided to a user, output to a monitor display, or stored in a memory.

19. A non-transitory, computer-readable data storage medium encoded with programming instructions, said storage medium being loaded into a control and processing system of a magnetic resonance (MR) apparatus that comprises a gradient coil system and a radio-frequency (RF) antenna system, said programming instructions causing said control and processing system to:

operate the gradient system of the MR apparatus in order to activate a slice selection gradient along a direction, said slice selection gradient having an amplitude and a polarity;

operate the RF antenna system of the MR apparatus in order to radiate an excitation pulse into an examination subject, situated in the MR apparatus, and thereby excite nuclear spins in a slice in the examination subject defined by the slice selection gradient;

operate the RF antenna system in order to radiate a RF refocusing pulse which refocuses dephased nuclear spins in the examination subject;

operate the gradient system in order to activate a readout gradient along said slice selection direction, said readout gradient that is being activated along the slice selection direction having an amplitude, and a polarity that is opposite to the polarity of the slice selection gradient;

operate the RF antenna system in order to read out MR data while the readout gradient is activated along the slice-selection direction;

reconstruct an MR image from the readout MR data;

identify image points in said reconstructed MR mage exhibiting a signal intensity that is greater than a predetermined threshold;

determine one image point, among said image points identified in said reconstructed MR image, that has a maximum separation between said determined one image point and said slice of the examination subject, occurring along said same direction as the activated slice-selection and readout gradients;

determine an actual measurement of said resonance frequency deviation dependent on said amplitude of the slice selection gradient, said amplitude of the readout gradient, and said maximum separation;

operate said gradient system in order to activate another slice selection gradient along said slice-selection direction;

operate the RF antenna system in order to radiate another RF excitation pulse into the examination subject and thereby excite nuclear spins in a slice of the examination subject defined by said another slice selection gradient;

operate said gradient system in order to activate a phase coding gradient a plurality of times along said slice-selection direction, and setting said plurality dependent on the actual measurement of said determined resonance frequency deviation;

operate said gradient system in order to activate a readout gradient along another direction, which is orthogonal to said slice-selection direction;

operate said RF antenna system in order to read out diagnostic MR data while said another readout gradient is activated along said another direction, which is orthogonal to said slice-selection direction; and reconstruct a generated diagnostic MR image from said diagnostic MR data which is then provided to a user, output to a monitor display, or stored in a memory.

20. A non-transitory, computer-readable data storage medium encoded with programming instructions, said storage medium being loaded into a control and processing system of a magnetic resonance (MR) apparatus that comprises a gradient coil system and a radio-frequency (RF) antenna system, said programming instructions causing said control and processing system to:

operate a gradient system of the MR apparatus in order to activate a slice selection gradient along a direction;

operate a radio-frequency (RF) antenna system of the MR apparatus in order to radiate an excitation pulse into an examination subject, situated in the MR apparatus, and thereby excite nuclear spins in a slice in the examination subject defined by the slice selection gradient;

operate the gradient system in order to activate a first readout gradient along said slice selection direction;

operate the RF antenna system in order to read out first MR data while the readout gradient is activated along the slice-selection direction;

reconstruct a first MR image from the first readout MR data;

identify image points in said reconstructed first MR image that exhibit a signal intensity that is greater than a predetermined threshold;

determine one image point, among the image points identified in said reconstructed first MR image, that has a first maximum separation between said determined one image point and said slice of the examination subject, occurring along said same direction as the activated slice-selection and readout gradients; and operate said gradient system in order to activate a second readout gradient along said same direction as the activated slice-selection gradient;

operate the RF antenna system in order to read out second MR data from the examination subject while the second readout gradient is activated along the slice-selection direction;

reconstruct a second MR image from the second readout MR data;

identify image points in said reconstructed second MR image that exhibit a signal intensity that is greater than a predetermined threshold;

determine one image point, among said image points identified in said reconstructed second MR image, that has a maximum separation between said determined one image point in said reconstructed second MR image and said slice of the examination subject, occurring along said same direction as the activated slice-selection and readout gradients;

determine an actual measurement of said resonance frequency deviation dependent on said first maximum separation, said second maximum separation, an amplitude of the first readout gradient, and an amplitude of the second readout gradient;

operate said gradient system in order to activate another slice selection gradient along said slice-selection direction;

operate the RF antenna system in order to radiate another RF excitation pulse into the examination subject and thereby excite nuclear spins in a slice of the examination subject defined by said another slice selection gradient occurring along said same direction as the activated slice-selection gradient;

operate said gradient system in order to activate a phase coding gradient a plurality of times along said slice-selection direction, and setting said plurality dependent on said determined actual measurement of resonance frequency deviation;

operate said gradient system in order to activate a readout gradient along another direction, which is orthogonal to said slice-selection direction;

operate said RF antenna system in order to read out diagnostic MR data while said another readout gradient is activated in said another direction which is orthogonal to said slice-selection direction; and reconstruct a diagnostic MR image from said diagnostic MR data which is then provided to a user, output to a monitor display, or stored in a memory.

* * * * *